US012756370B2

(12) United States Patent
Ellison et al.

(10) Patent No.: US 12,756,370 B2
(45) Date of Patent: Oct. 6, 2026

(54) AUTOMATIC VOLUME LEVELING

(71) Applicant: Bose Corporation, Framingham, MA (US)

(72) Inventors: Brian Ellison, Holladay, UT (US); Gabriel Olochwoszcz, Hillsborough, NJ (US); Michael W. Stark, Acton, MA (US)

(73) Assignee: Bose Corporation, Framingham, MA (US)

(*) Notice: Subject to any disclaimer, the term of this patent is extended or adjusted under 35 U.S.C. 154(b) by 140 days.

(21) Appl. No.: 18/674,041

(22) Filed: May 24, 2024

(65) Prior Publication Data

US 2025/0364963 A1 Nov. 27, 2025

(51) Int. Cl.

| | |
|---|---|
| ***H03G 5/02*** | (2006.01) |
| ***H03G 3/32*** | (2006.01) |
| ***H03G 5/16*** | (2006.01) |
| ***H03G 7/00*** | (2006.01) |
| ***H03G 9/00*** | (2006.01) |
| *H04R 3/04* | (2006.01) |

(52) U.S. Cl.

CPC ............... *H03G 3/32* (2013.01); *H03G 5/025* (2013.01); *H03G 5/165* (2013.01); *H03G 7/005* (2013.01); *H03G 9/005* (2013.01); *H04R 3/04* (2013.01)

(58) Field of Classification Search

CPC ........ H04R 2430/01; H03G 3/32; H03G 3/24; H03G 3/34; H03G 5/025; H03G 5/165

USPC ............................................ 381/104–109, 56

See application file for complete search history.

(56) References Cited

U.S. PATENT DOCUMENTS

| | | | | |
|---|---|---|---|---|
| 9,692,382 | B2 * | 6/2017 | Isberg | G11B 27/034 |
| 9,755,598 | B2 | 9/2017 | Olochwoszcz et al. | |
| 9,954,506 | B2 * | 4/2018 | Seefeldt | H03G 9/24 |
| 10,466,959 | B1 | 11/2019 | Yang et al. | |
| 11,323,086 | B2 * | 5/2022 | Friant | G01S 19/14 |
| 11,533,575 | B2 * | 12/2022 | Ward | H04S 1/002 |
| 11,775,250 | B2 * | 10/2023 | Cremer | G06N 3/09 381/57 |

(Continued)

FOREIGN PATENT DOCUMENTS

| | | | |
|---|---|---|---|
| EP | 2101411 | A1 | 9/2009 |
| EP | 2956936 | B1 | 4/2019 |

OTHER PUBLICATIONS

International Search Report and the Written Opinion of the International Searching Authority, PCT Application No. PCT/US2025/028586, dated Aug. 12, 2025, 15 pages.

*Primary Examiner* — Disler Paul

(74) *Attorney, Agent, or Firm* — Bond, Schoeneck & King, PLLC

(57) ABSTRACT

An audio device is provided. The audio device comprises a controller and an acoustic transducer. The controller is configured to receive an input audio signal. The controller is further configured to generate, via a loudness detector, a loudness level of a first portion of the input audio signal. The controller is further configured to identify a compression curve of a plurality of compression curves corresponding to a user volume setting. The controller is further configured to adjust, via an audio compressor, a second portion of the input audio signal based on the loudness level and the compression curve to generate an output audio signal. The loudness level is determined according to LUFS model.

20 Claims, 9 Drawing Sheets

(56) References Cited

U.S. PATENT DOCUMENTS

| | | | | |
|---|---|---|---|---|
| 12,008,287 | B2 * | 6/2024 | Mogul | G06F 3/165 |
| 12,185,077 | B2 * | 12/2024 | Ward | G10L 19/008 |
| 12,596,521 | B1 * | 4/2026 | Chen | G06F 3/165 |
| 2013/0144615 | A1 | 6/2013 | Rauhala et al. | |
| 2014/0037108 | A1 | 2/2014 | Christoph | |
| 2014/0140537 | A1 | 5/2014 | Soulodre | |
| 2023/0065233 | A1 | 3/2023 | Checa et al. | |

* cited by examiner

AUTOMATIC VOLUME LEVELING

FIELD OF THE DISCLOSURE

The present disclosure is generally directed to automatic volume leveling, and more specifically, to systems and methods for adjusting audio signals based on detected loudness.

BACKGROUND

Audio volume level mismatch between different types of content provided by a single source is a common issue with modern media consumption. For example, commercials broadcast during television programs are often significantly louder than the programming they are interrupting. This variation in loudness is often annoying and/or discomforting to the user. Further, it is often impractical to require the user to manually reduce the volume of their television during the commercial, as the commercial will often be over (or nearly over) by the time the user is ready to reduce the volume via remote control or other means. One existing solution for automatic volume leveling is dynamic range compression. In dynamic range compression (DRC), an input signal is attenuated or amplified based on its input power level. However, the input power level may not provide an accurate representation of the varying loudness experienced by the user which causes annoyance and discomfort. Further, the response of DRC may result in an undesirable reduction of short-term loudness bursts, such as explosions in a television program.

SUMMARY

The present disclosure is generally directed to systems and methods for automatic volume leveling. In particular, the present disclosure describes near-real time adjustment of audio signals based on detected loudness. These systems and methods are implemented by an audio device, such as a soundbar or speaker. The audio device includes a controller configured to determine a loudness level of a first portion of an input audio signal. The audio device then identifies a compression curve based on a user volume setting. The identified compression curve is then applied to a second portion of the input audio signal to generate an output audio signal. The second portion of the input audio signal occurs within seconds of the first portion, enabling the controller to adjust the input audio signal in near-real time. The user volume setting is then applied to the output audio signal, and the volume-adjusted signal is then provided to an acoustic transducer to generate audio for a user to hear.

The loudness level of the first portion of the input audio signal is measured according to a Loudness Unit Full Scale (LUFS) model as defined by the International Telecommunication Union (ITU) BS.1770 loudness specification. The LUFS model measures the input audio signal over integration periods, such as three second periods. Using the LUFS model provides a perceptual model of loudness reflecting the loudness a user will experience, rather than a simple power measurement. Further, measuring the loudness of the signal over three second periods allows for near-real time adjustment of the input audio signal while also allowing short-term loudness bursts to be provided to the user at a reasonable volume (such as explosions in a motion picture).

The controller stores a plurality of compression curves in memory. Each compression curve comprises a pivot point, a downward compression portion, and an upward compression portion. All of the compression curves share a common pivot point. Further, each of the plurality of compression curves corresponds to a user volume setting. If the user volume setting is set very low, a compression curve is implemented which amplifies low volume audio sources, while attenuating high volume audio sources. The amount of amplification or attenuation decreases as the user volume setting increases.

Generally, in one example, an audio device is provided. The audio device comprises a controller. The controller is configured to receive an input audio signal. The input audio signal comprises a first portion and a second portion. The first portion of the input audio signal begins at a first time. The second portion of the input audio signal begins at a second time following the first time. A difference between the first time and the second time is no greater than an adjustment timing period.

The controller is further configured to generate, via a loudness detector, a loudness level of the first portion of the input audio signal.

The controller is further configured to identify a compression curve of a plurality of compression curves corresponding to a user volume setting.

The controller is further configured to adjust, via an audio compressor, the second portion of the input audio signal based on the loudness level and the compression curve to generate an output audio signal.

According to an example, the adjustment timing period is no greater than approximately six seconds.

According to an example, the audio device further comprises an acoustic transducer. The acoustic transducer is configured to generate audio corresponding to the output audio signal.

According to an example, a volume level of the output audio signal is adjusted according to the user volume setting.

According to an example, the compression curve comprises a pivot point, a downward compression portion, and an upward compression portion. The downward compression portion may correspond to a first input power range greater than the pivot point. The upward compression portion may correspond to a second input power range less than the pivot point.

According to an example, the loudness level is an integrated loudness of the input audio signal over an integration period.

According to an example, the integration period is approximately three seconds.

According to an example, the loudness level is determined according to LUFS model.

According to an example, the controller is configured to disable the adjustment of the second portion of the input audio signal based on a receiving an adjustment disabling signal.

According to an example, the audio device further includes a disable switch configured to generate the adjustment disabling signal.

According to an example, the audio device is a soundbar or a speaker.

According to an example, the input audio signal corresponds to a High-Definition Multimedia Interface (HDMI) signal or an optical audio signal.

According to an example, the controller is further configured to determine a content type of the input audio signal. The adjustment of the second portion of the input audio signal is disabled if the content type is music content.

According to an example, the compression curve has a frequency range of 20 Hz to 20 kHz.

Generally, in another aspect, a method for adjusting an input audio signal is provided. The method includes receiving, via a controller, the input audio signal. The input audio signal comprises a first portion and a second portion. The first portion of the input audio signal begins at a first time. The second portion of the input audio signal begins at a second time following the first time. A difference between the first time and the second time is no greater than an adjustment timing period.

The method further includes generating, via a loudness detector of the controller, a loudness level of the first portion of the input audio signal.

The method further includes identifying, via the controller, a compression curve of a plurality of compression curves corresponding to a user volume setting.

The method further includes adjusting, via an audio compressor of the controller, the second portion of the input audio signal based on the loudness level and the compression curve to generate an output audio signal.

According to an example, the method further comprises generating, via an acoustic transducer, audio corresponding to the output audio signal.

According to an example, the method further comprises adjusting a volume level of the output audio signal according to the user volume setting.

According to an example, the compression curve comprises a pivot point, a downward compression portion, and an upward compression portion.

According to an example, the downward compression portion corresponds to a first input power range greater than the pivot point. The upward compression portion corresponds to a second input power range less than the pivot point.

In various implementations, a processor or controller can be associated with one or more storage media (generically referred to herein as "memory," e.g., volatile and non-volatile computer memory such as ROM, RAM, PROM, EPROM, and EEPROM, floppy disks, compact disks, optical disks, magnetic tape, Flash, OTP-ROM, SSD, HDD, etc.). In some implementations, the storage media can be encoded with one or more programs that, when executed on one or more processors and/or controllers, perform at least some of the functions discussed herein. Various storage media can be fixed within a processor or controller or can be transportable, such that the one or more programs stored thereon can be loaded into a processor or controller so as to implement various aspects as discussed herein. The terms "program" or "computer program" are used herein in a generic sense to refer to any type of computer code (e.g., software or microcode) that can be employed to program one or more processors or controllers.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also can appear in any disclosure incorporated by reference should be accorded a meaning most consistent with the particular concepts disclosed herein.

Other features and advantages will be apparent from the description and the claims.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the various embodiments.

DETAILED DESCRIPTION

The present disclosure is generally directed to systems and methods for automatic volume leveling. In particular, the present disclosure describes near-real time adjustment of audio signals based on detected loudness. These systems and methods are implemented by an audio device, such as a soundbar or speaker. The audio device includes a controller configured to determine a loudness level of a first portion of an input audio signal. The audio device then identifies a compression curve based on a user volume setting. The identified compression curve is then applied to a second portion of the input audio signal to generate an output audio signal. The second portion of the input audio signal occurs within seconds of the first portion, enabling the controller to adjust the input audio signal in near-real time. The user volume setting is then applied to the output audio signal, and the volume-adjusted signal is then provided to an acoustic transducer to generate audio for a user to hear.

The following description should be read in view of FIGS. 1-9.

Figure 1:
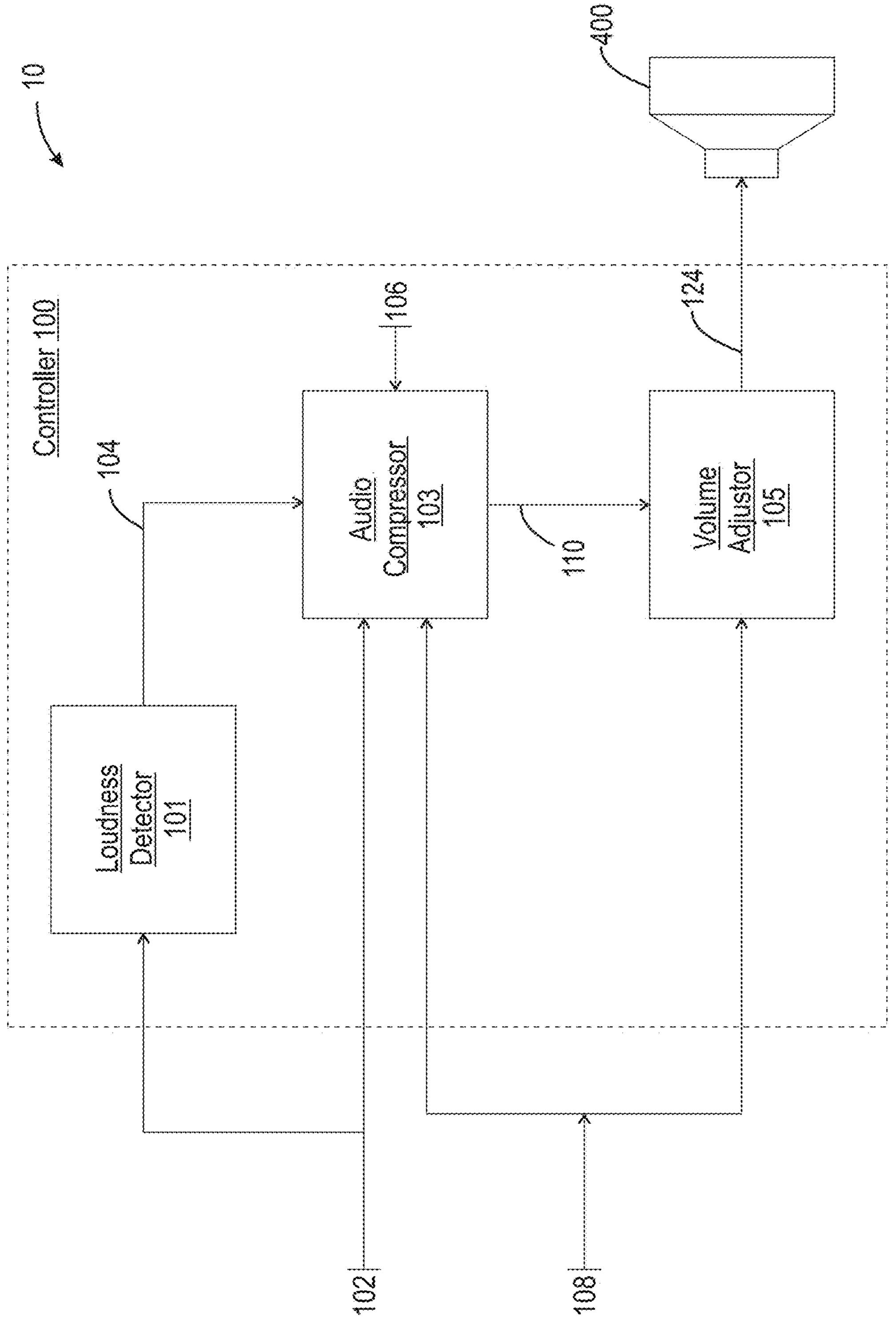
FIG. 1 is a functional block diagram of aspects of an audio device including an audio compressor, in accordance with an example.

FIG. 1 is a functional block diagram of a non-limiting example of an audio device 10. Generally, the audio device 10 comprises at least a controller 100 and an acoustic transducer 400. In some examples, the audio device 10 may be a soundbar or a speaker coupled to a peripheral device, such as a television set, smartphone, personal computer, laptop computer, tablet computer, etc., via wired or wireless connection. In some examples, the audio device is coupled to a television via a High-Definition Multimedia Interface (HDMI) connection or an optical connection.

As shown in FIG. 1, the controller 100 includes a loudness detector 101, an audio compressor 103, and a volume adjustor 105. These aspects may be implemented via any combination of hardware or software components, including digital signal processing (DSP) components such as an ARM processor. Further, the controller 100 is configured to receive at least two inputs, an input audio signal 102 and a user volume setting 108. In some examples, the input audio signal 102 is received from a peripheral device, such as a television or smartphones. For example, the input audio signal 102 may correspond to an HDMI signal or an optical signal provided by a television set. The user volume setting 108 may similarly be provided via a variety of sources. In some examples, a user may enter the user volume setting 108 into the audio device 10 via physical or virtual buttons arranged on the audio device 10. In other examples, the user may convey the desired user volume setting 108 to the audio device 10 via a remote control or similar device.

The input audio signal 102 is provided to the loudness detector 101. As opposed to a power level detector of a typical dynamic range compression (DRC) system, the loudness detector 101 is configured to generate a loudness level 104 representative of the perceived loudness of the input audio signal 102 as would be experienced by a user prior to the implementation of any volume adjustment due to the user volume setting 108. In some examples, the loudness level 104 is measured according to a Loudness Unit Full Scale (LUFS) model as defined by the International Telecommunication Union (ITU) BS.1770 loudness specification. As will be described in further detail with respect to FIGS. 3A and 3B, the LUFS model analyzes the input audio signal 102 over an integration period 118 to determine the loudness level 104. In a preferred example, the integration period 118 is approximately three seconds. In other examples, the integration period 118 may be any practical time period.

As shown in FIG. 1, the audio compressor 103 receives the input audio signal 102, the loudness level 104, a series of compression curves 106, and the user volume setting 108. The compression curves 106 will be described in more detail with respect to FIG. 2. Each compression curve 106 defines the amount of gain or attenuation to be applied to the input audio signal 102 based on the loudness level 104 of the input audio signal 102. Most of the compression curves 106 are defined such that quiet input audio signals 102 are amplified to enable the user to better hear the content of the input audio signal 102 (such as dialogue in a television program), while loud input audio signals 102 are attenuated to prevent user discomfort (such as during a television commercial with significantly louder audio than the accompanying television program).

The audio compressor 103 chooses one of the compression curves 106 to apply to the input audio signal 102 based on the user volume setting 108. In some examples, the intensity of the amplification and attenuation of the compression curves 106 increase as the user volume setting 108 decreases, thereby reducing the loudness of loud portions of the input audio signal 102 (such as loud commercials) and increasing the loudness of quiet portions (such as quiet dialogue) when the user has turned down the volume of the audio device 10. In other examples, the amplification and attenuation of the compression curves 106 will be minimal at high user volume settings 108. Further, the frequency response of the compression curves 106 is typically flat over the audible frequency ranges of 20 Hz to 20 kHz.

Accordingly, the audio compressor 103 generates an output audio signal 110 by applying the identified compression curve 106 to the input audio signal 102. As the compression curve 106 is applied before any volume adjustment, applying the compression curve 106 to the input audio signal 102 is considered a pre-mastering processing step. The output audio signal 110 is then provided to the volume adjustor 105. The volume adjustor 105 applies the user volume setting 108 to the output audio signal 110 to adjust a volume level of the output audio signal 110 and to generate a volume-adjusted signal 124. The volume-adjusted signal 124 is then provided to the acoustic transducer 400 to generate audio to be heard by the user.

Figure 2:
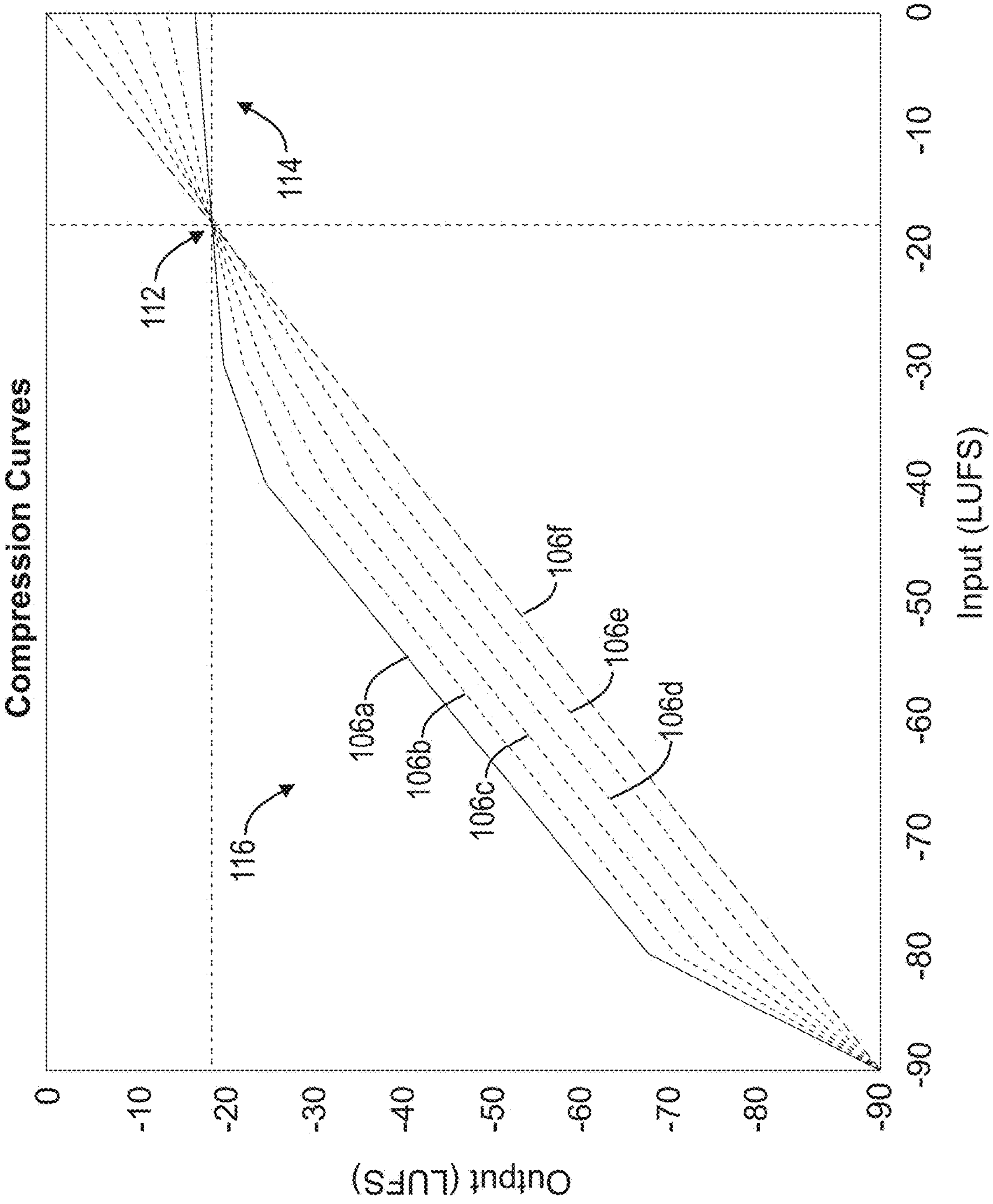
FIG. 2 illustrates a series of compression curves, in accordance with an example.

FIG. 2 illustrates a non-limiting series of compression curves 106. In particular, FIG. 2 shows six compression curves 106*a-f* as functions of an input loudness level and an output loudness level. The compression curves 106*a-f* shown in FIG. 2 are for illustrative and explanatory purposes, and may not correspond to actual compression curves used to adjust audio signals. The various compression curves 106*a*-106*f* correspond to different user volume settings 108. In particular, first compression curve 106*a* corresponds to a very low user volume setting 108, sixth compression curve 106*f* corresponds to a very high user volume setting 108, while the other compression curves 106*b*-106*e* correspond to user volume settings 108 between very low and very high.

Each compression curve 106 is defined by a pivot point 112, a downward compression portion 114, and an upward compression portion 116. The pivot point 112 corresponds to the transition from the downward compression portion 114 to the upward compression portion 116. In the example of FIG. 2, the downward compression portion 114 of each compression curve 116 corresponds to input loudness levels greater than the loudness level at the pivot point 112. Similarly, the upward compression portion 116 of each compression curve 106 corresponds to input loudness levels less than the loudness level at the pivot point 112.

In some examples, each of the compression curves 106*a*-106*f* of the plurality of compression curves 106 shares the same pivot point 112. In the example of FIG. 2, the pivot point 112 corresponds to an input signal with a loudness level of −18 LUFS and an output signal with a loudness level of −18 LUFS. Accordingly, regardless of the user volume setting 108, the compression curves 106 will have no effect on an input signal with a loudness level of −18 LUFS.

The downward compression portion 114 represents the portion of the compression curve 106 which attenuates the input signal, while the upward compression portion 116 represents the portion of the compression curve 106 which amplifies the input signal. For example, if the input signal has a loudness level of −40 LUFS and the user volume setting 108 is very high, the first compression curve 106*a* increases the loudness of the input signal to approximately −23 LUFS. Similarly, if the loudness level of the input signal then increases to −10 LUFS while the user volume setting 108 remains very high, the loudness level of then input signal the decreases to −18 LUFS. Amplifying input signals with low loudness levels allows for a user who has selected a low user volume setting 108 to better hear, for example, quiet dialogue in a television program. Similarly, attenuating input signals with high loudness levels reduces potential annoyance or discomfort from a loud commercial following the quiet dialogue.

As shown in FIG. 2 the intensity of the amplification and attenuation provided by the compression curves 106 decreases as the user volume setting 108 increases. If the user input volume 108 is significantly high, the user should be able to hear quiet dialogue with minimal assistance. Further, the high user input volume 108 indicates that the user is likely unconcerned with commercials being noticeably louder than the program itself. Accordingly, at the highest user volume setting 108, the sixth compression curve 106*f* has at most a minimal impact on the input signal.

Figure 3A:
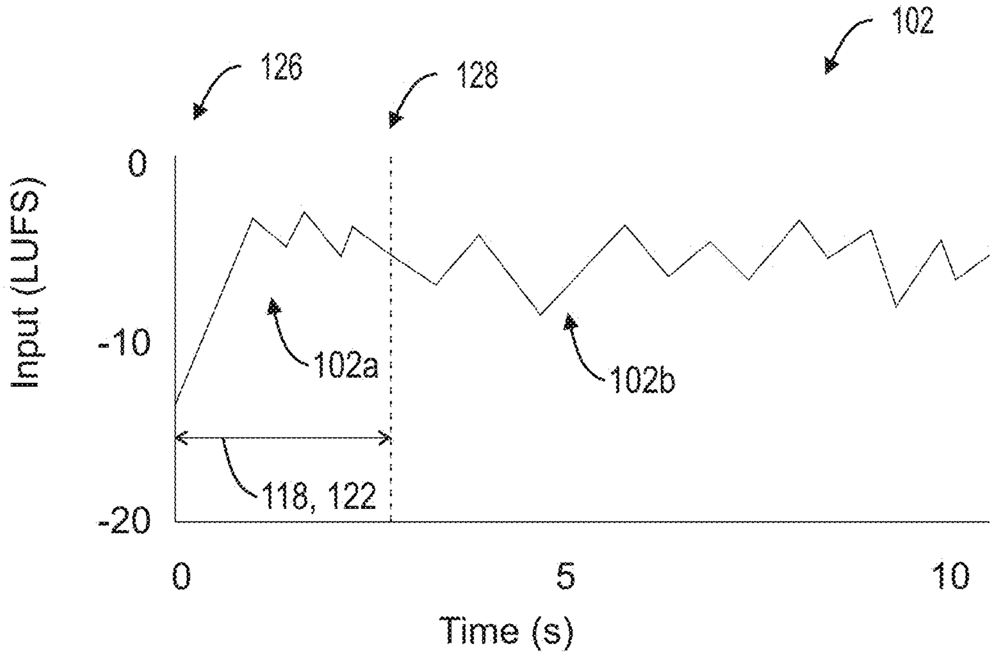
FIG. 3A illustrates timing aspects of an input audio signal, in accordance with an example.
Figure 3B:
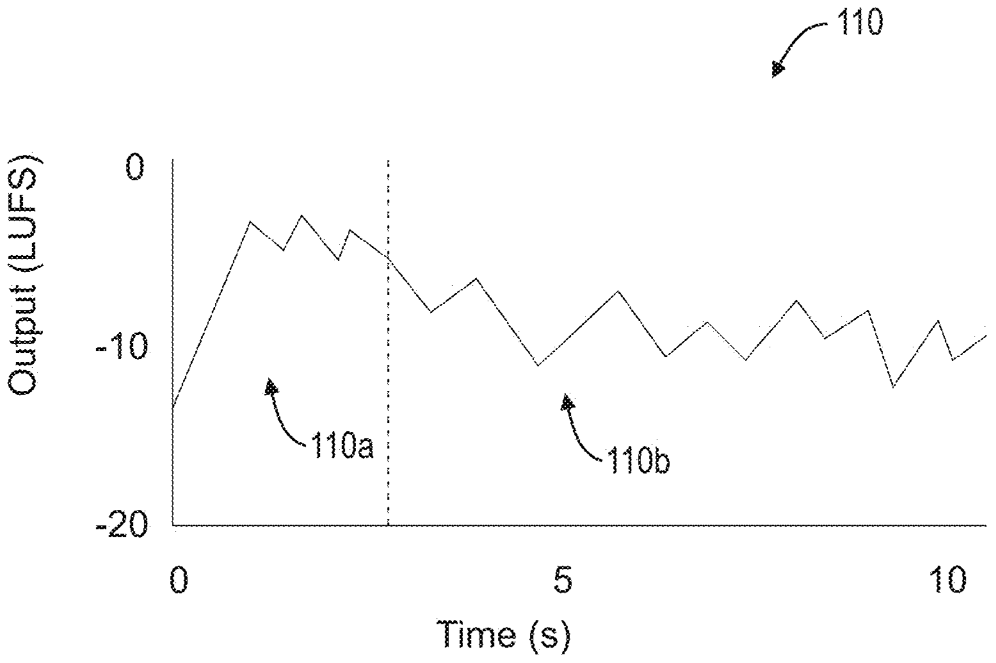
FIG. 3B illustrates timing aspects of an output audio signal, in accordance with an example.

FIGS. 3A and 3B illustrate non-limiting examples of the timing aspects of measuring and near-real time compressing the input audio signal 102 and the output audio signal 110. FIG. 3A illustrates the input audio signal 102 as divided into two portions, a first portion 102*a* and a second portion 102*b*.

Similarly, FIG. 3B illustrates the output audio signal 110 divided into two portions, a first portion 102*a* and a second portion 102*b*. The first portion 102*a* of the input audio signal 102 begins at a first time 126, while the second portion 102*b* begins at a second time 128. The difference between the first time 126 and the second time 128 may be defined as an adjustment timing period 122. In the example of FIG. 3A, the adjustment timing period 122 is shown as approximately three seconds. In some examples, the adjustment timing period 122 may be as long as six seconds, or any length of time between three seconds and six seconds.

Generally, the loudness detector 101 (as shown in FIG. 1) measures the loudness level 104 of the first portion 102*a* of the input audio signal 102. The audio compressor 103 (as also shown in FIG. 1) then adjusts the second portion 102*b* of the input audio 102 to generate the output audio signal 110 based on (1) the loudness level 104 and (2) the compression curve 106 corresponding to the user volume setting 108. In a preferred example, the loudness level of the first portion 102*a* of the input audio signal 102 is measured according to the LUFS model as defined by the International Telecommunication Union (ITU) BS.1770 loudness specification. The LUFS model determines the loudness level 104 of the first portion 102*a* of the input audio signal 102 over an integration period 118. In some non-limiting examples, and as depicted in FIG. 3A, the integration period 118 is approximately three seconds.

Accordingly, in the examples of FIGS. 3A and 3B, the loudness detector 101 determines the loudness level 104 of the first portion 102*a* of the input signal 102. Based on the loudness level 104 and the compression curve 106 corresponding to the user volume setting 108, the second portion 102*b* of the input volume signal 102*b* is then gradually attenuated to reach the appropriate attenuation level of approximately 5 LUFS. This attenuation results in the output signal 102 as shown in FIG. 3B, with the second portion 110*b* of the output audio signal 110 gradually attenuated relative to the second portion 102*b* of the input signal 102.

The loudness level 104 of the input signal 102 is continuously determined during the duration of the input signal 102. In some examples, the loudness level 104 is measured at least every three seconds. Continuously measuring the loudness of the signal over the integration periods 118 allows for near-real time adjustment of the input audio signal 102 while also allowing short-term loudness bursts to be provided at a reasonable volume to provide their desired effect (such as explosions in a motion picture).

Figure 4:
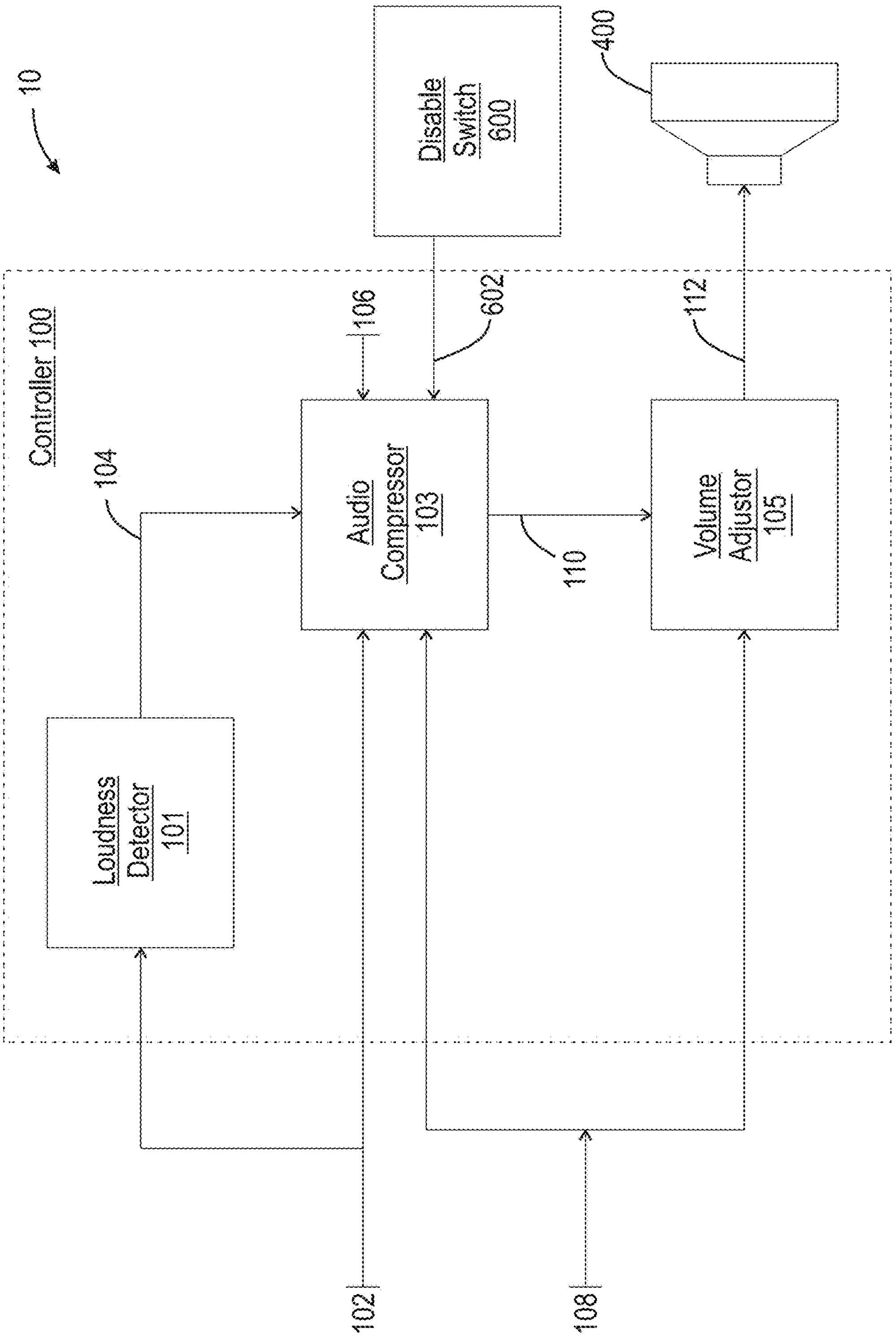
FIG. 4 is a functional block diagram of aspects of an audio device including a disable switch for disabling the audio compressor, in accordance with an example.

FIG. 4 is another non-limiting example of a functional block diagram of aspects of the audio device 10. In this example, the block diagram depicts a disable switch 600 for disabling the audio compressor 103. In particular, the disable switch 600 is configured to provide the audio compressor 103 with an adjustment disabling signal 602. Upon receiving the adjustment disabling signal 602, the audio compressor 103 simply passes on input audio signal 102 to the volume adjustor 105 as the output audio signal 110 without applying any amplification or attenuation to the input audio signal 102. The disable switch 600 may be provided to the user in any practical manner. In some examples, the disable switch 600 may be a physical or virtual switch on the audio device 10. In other examples, the disable switch 600 may be a software component provided to the user via a mobile application on a smartphone or tablet computer in wireless communication (such as via Bluetooth or Wi-Fi) with the audio device 10.

Figure 5:
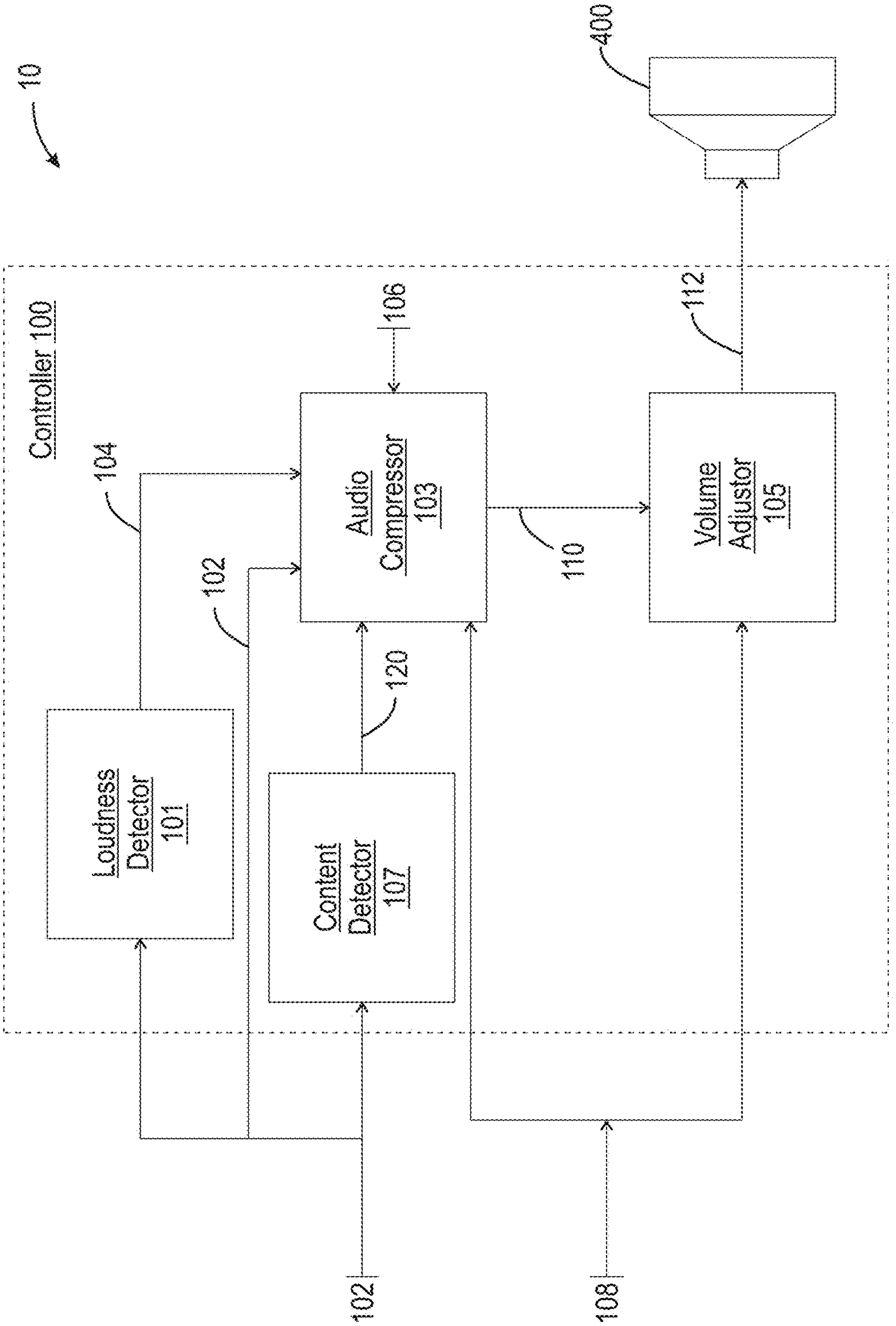
FIG. 5 is a functional block diagram of aspects of an audio device including a content detector, in accordance with an example.

FIG. 5 is a further non-limiting example of a functional block diagram of aspects of the audio device 10. In this example, the block diagram depicts the controller 100 including a content detector 111. The content detector 111 is configured to analyze the input audio signal to detect the type of audio being conveyed by the input audio signal 102 and to generate a corresponding content type signal 120. The audio compressor 103 analyzes the content type signal 120 to decide whether to disable the application of the compression curve 106 to the input audio signal 102. For example, compressing musical content may result in a degraded user experience by impacting the dynamics of a track. Accordingly, the audio compressor 103 may be configured to pass on the input audio signal 102 to the volume adjustor 105 as the audio output signal 110 if the content type signal 120 identifies the current content type as "music." In other examples, if the content type signal 120 corresponds to "television program" or "podcast," the audio compressor 103 may then apply the appropriate compression curve 106 to the input audio signal 102.

Figure 6:
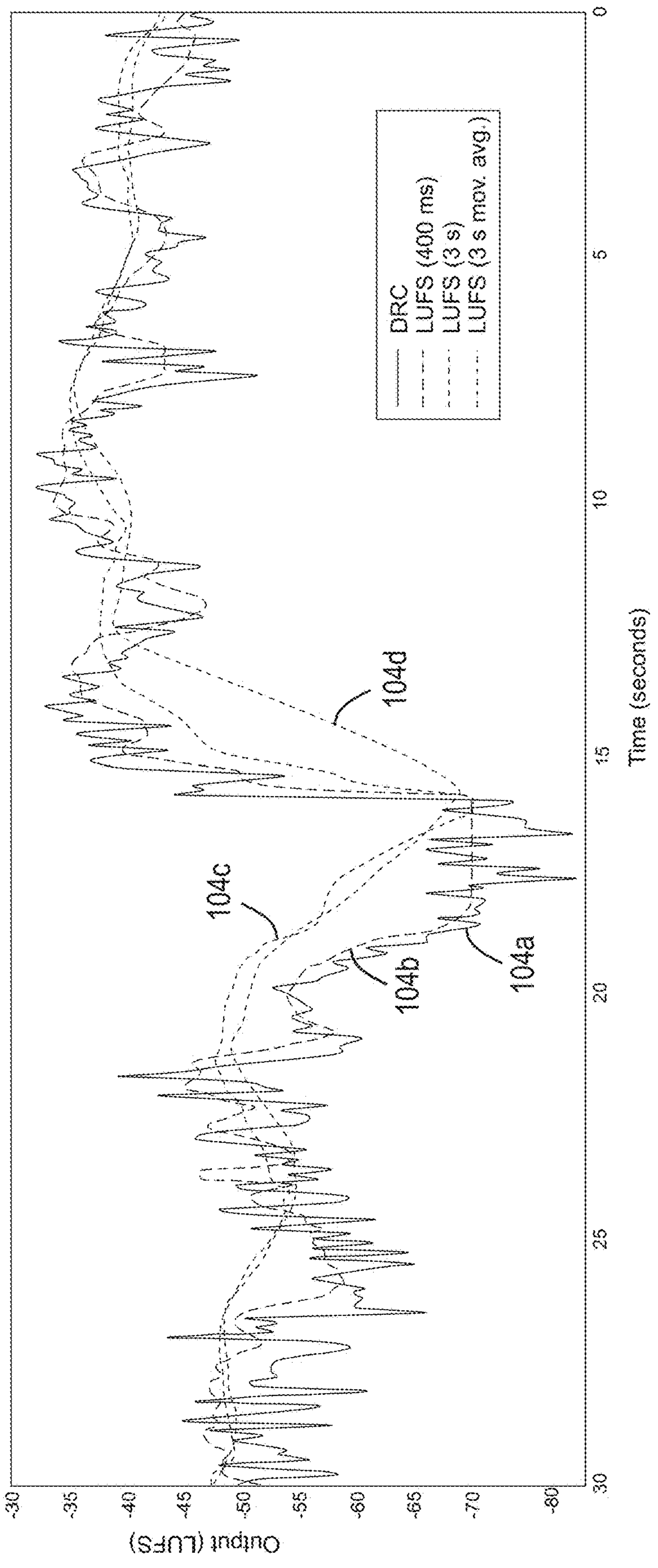
FIG. 6 illustrates an output audio signal processed according to various methods, in accordance with an example.

FIG. 6 illustrates various loudness level signals 104*a*-104*d* processed according to different methods for determining loudness. For each loudness level signal 104*a*-104*d*, the calculated loudness determines the compression applied to the input audio signal 102 to generate the output audio signal 110. The first loudness level signal 104*a* is generated using instantaneous loudness calculations, such as those used in DRC. As a result, the first loudness level signal 104*a* increases and decreases wildly over the 30 second period shown in FIG. 6, resulting in the user experiencing sudden, undesirable increases and decreases in loudness. The second loudness level signal 104*b* is generated using LUFS measurements using integration periods 118 of 400 milliseconds. Accordingly, the second loudness level signal 104*b* exhibits a faster response than signals implementing other types of LUFS, and more closely follows the first signal 104*a*. This type of LUFS measurement may be referred to as "momentary LUFS." The third loudness level signal 104*c* is generated using LUFS measurements using integration periods 118 of 3 seconds. The fourth loudness level signal 104*d* is generated using moving averages of the momentary LUFS measurements. Accordingly, the third loudness level signal 104*c* and the fourth signal exhibit slower responses than the first loudness level signal 104*a* or the second loudness level signal 104*d*. More generally, FIG. 6 corresponds to a scene in a film which starts quietly until a serious of explosions occur at the 17 second mark.

Figure 7:
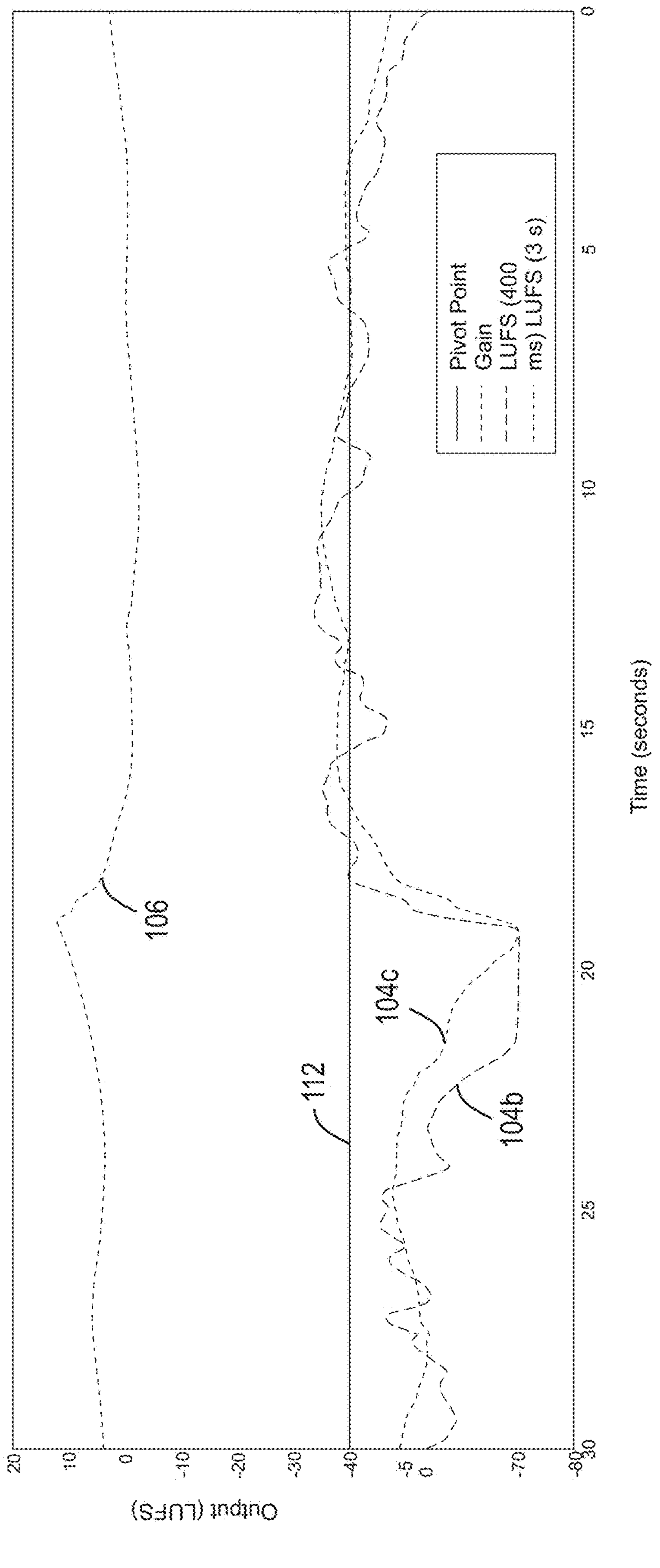
FIG. 7 illustrates an output audio signal processed according to various methods, in accordance with an example.

FIG. 7 is a further graphical depiction of the same scene as FIG. 6. As with FIG. 6, FIG. 7 shows the second loudness level signal 104*b* corresponding to momentary LUFS measurements and the third loudness level signal 104*c* corresponding to 3 second LUFS measurements. FIG. 7 also depicts pivot point 112 at −40 LUFS, as well as the impact of a compression curve 106 over time on the third loudness level signal 104*c*. As depicted in FIG. 7, a positive gain (amplification) is applied when the third loudness level signal 104*c* is below the pivot point 112, and a negative gain (attenuation) is applied when the third loudness level signal 104*c* is above the pivot point 112. As with FIG. 6, the increased loudness level signals at and beyond the 17 second mark correspond to sudden explosions in a film scene. The system will continuously adjust the output loudness level signals, but due to the three second integration period 118 used to generate the third loudness level signal 104*c*, it takes the system about three seconds from the beginning of the explosions to reach the appropriate attenuation level and finish responding to the change in loudness of the input audio signal 102. Accordingly, the user would experience the dynamics of the sudden explosions, but sustained loudness of a "too-loud" television commercial would be reduced.

Figure 8:
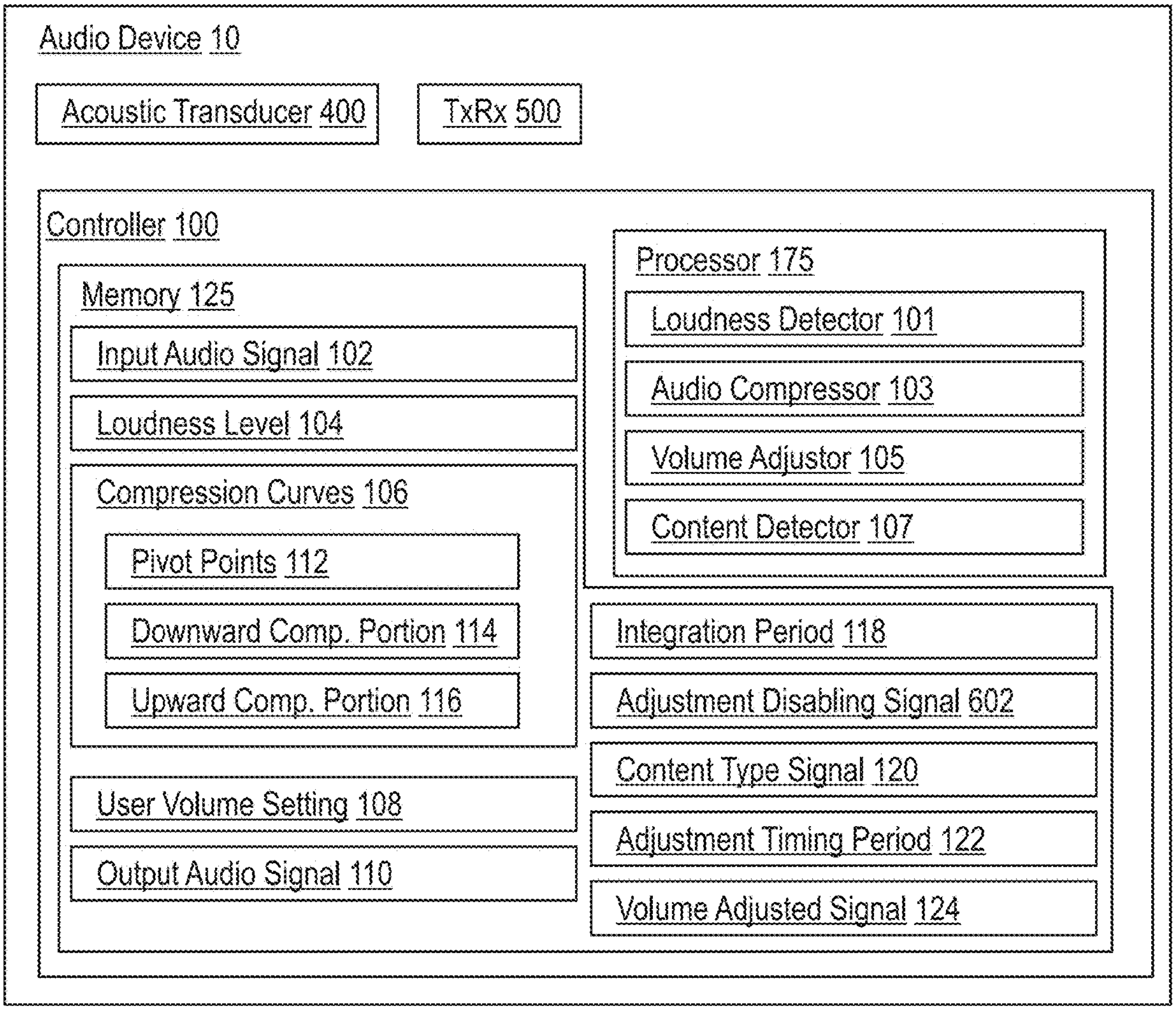
FIG. 8 is a schematic diagram of an audio device, in accordance with an example.

FIG. 8 is a schematic diagram of the audio device 1. Broadly, the audio device 1 includes the controller 100, the acoustic transducer 400, and the transceiver 500. The controller 100 includes memory 125 and processor 175. The memory 125 may store a wide variety of data received by or generated by the controller 100, including the input audio signal 102, the loudness level 104, the compression curves 106 (including the pivot point(s) 112, the downward compression portions 114, and the upward compression portions 116), the user volume setting 108, the output audio signal 110, the integration period 118, the content type signal 120, the adjustment timing period 122, the volume-adjusted signal 124, and the adjustment disabling signal 602. The processor 175 processes the aforementioned data using the loudness detector 101, the audio compressor 103, the volume adjustor 105, and the content detector 107. The acoustic transducer 400 is configured to render audio to the user. The transceiver 500 is configured to enable wireless communication between the audio device 10 and wireless devices such as a smartphone, laptop computer, desktop computer, tablet computer, etc.

Figure 9:
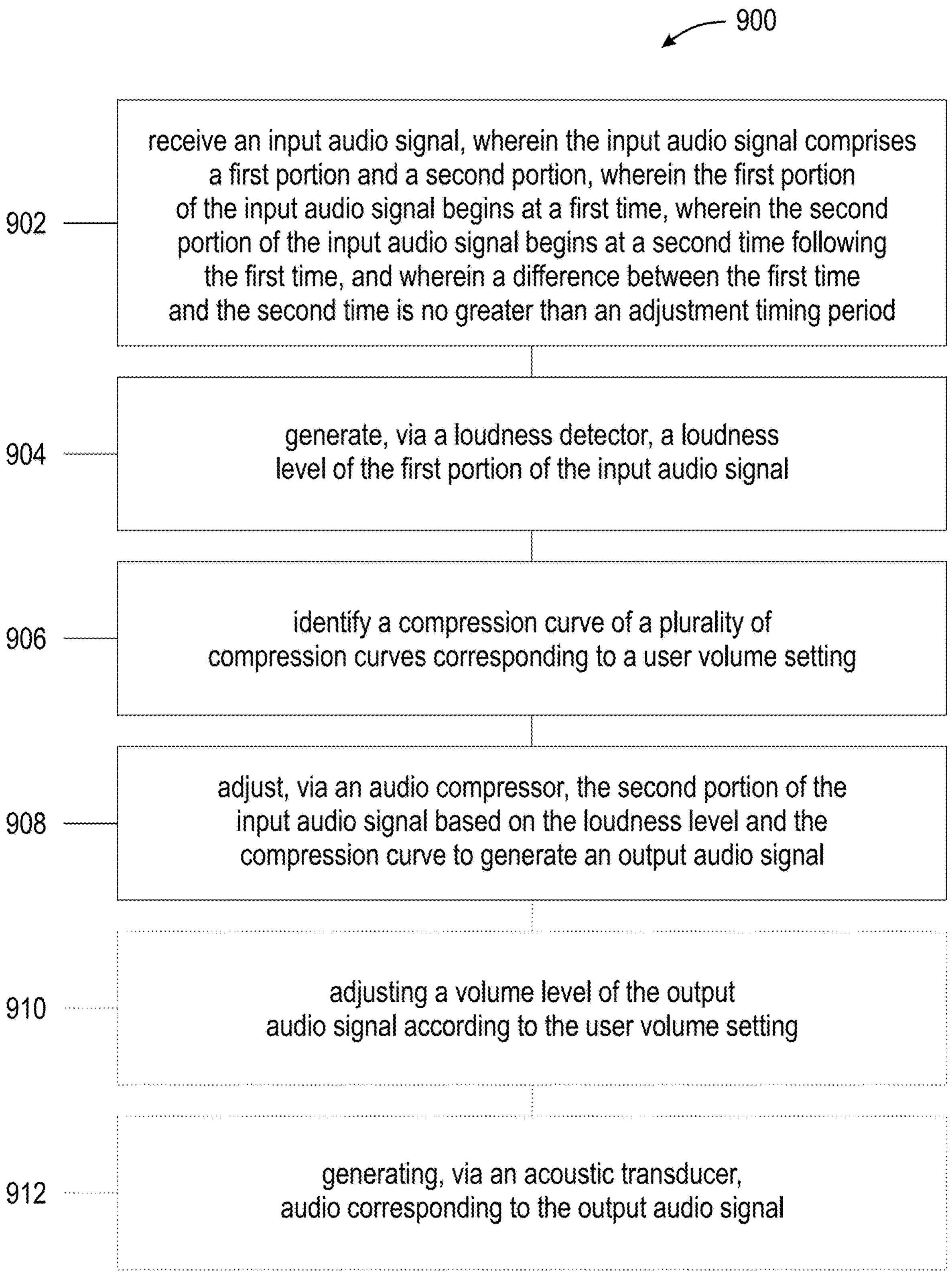
FIG. 9 is a flow chart of a method for adjusting an input audio signal, in accordance with an example.

FIG. 9 is a flowchart of a method 900 adjusting an input audio signal 102. Referring to FIGS. 1-9, the method 900 includes, in step 902, receiving, via a controller 100, the input audio signal 102. The input audio signal 102 comprises a first portion 102*a* and a second portion 102*b*. The first portion 102*a* of the input audio signal 102 begins at a first time 126. The second portion 102*b* of the input audio signal 102 begins at a second time 128 following the first time 126. A difference between the first time 126 and the second time 128 is no greater than an adjustment timing period 122.

The method 900 further includes, in step 904 generating, via a loudness detector 101 of the controller 100, a loudness level 104 of the first portion 102*a* of the input audio signal 102.

The method 900 further includes, in step 906, identifying, via the controller 100, a compression curve 106 of a plurality of compression curves 106 corresponding to a user volume setting 108.

The method 900 further includes, in step 908, adjusting, via an audio compressor 103 of the controller 100, the second portion 102*b* of the input audio signal 102 based on the loudness level 104 and the compression curve 106 to generate an output audio signal 110.

According to an example, the method 900 further includes, in optional step 910, generating, via an acoustic transducer 400, audio corresponding to the output audio signal 110.

According to an example, the method 900 further includes, in optional step 912, adjusting a volume level of the output audio signal 110 according to the user volume setting 108.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements can optionally be present other than the elements specifically identified by the "and/or" clause, whether related or unrelated to those elements specifically identified.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements can optionally be present other than the elements specifically identified within the list of elements to which the phrase "at least one" refers, whether related or unrelated to those elements specifically identified.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The above-described examples of the described subject matter can be implemented in any of numerous ways. For example, some aspects can be implemented using hardware, software or a combination thereof. When any aspect is implemented at least in part in software, the software code can be executed on any suitable processor or collection of processors, whether provided in a single device or computer or distributed among multiple devices/computers.

The present disclosure can be implemented as a system, a method, and/or a computer program product at any possible technical detail level of integration. The computer program product can include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some examples, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to examples of the disclosure. It will be understood that each block of the flowchart illustrations and/or block diagrams, and combinations of blocks in the flowchart illustrations and/or block diagrams, can be implemented by computer readable program instructions.

The computer readable program instructions can be provided to a processor of a, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various examples of the present disclosure. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Other implementations are within the scope of the following claims and other claims to which the applicant can be entitled.

While various examples have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the examples described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings is/are used. Those skilled in the art will recognize, or be able to ascertain using no more than routine experimentation, many equivalents to the specific examples described herein. It is, therefore, to be understood that the foregoing examples are presented by way of example only and that, within the scope of the appended claims and equivalents thereto, examples can be practiced otherwise than as specifically described and claimed. Examples of the present disclosure are directed to each individual feature, system, article, material, and/or method described herein. In addition, any combination of two or more such features, systems, articles, materials, and/or methods, if such features, systems, articles, materials, and/or methods are not mutually inconsistent, is included within the scope of the present disclosure.

What is claimed is:

1. An audio device comprising a controller configured to:

receive an input audio signal, wherein the input audio signal comprises a first portion and a second portion, wherein the first portion of the input audio signal begins at a first time, wherein the second portion of the input audio signal begins at a second time following the first time, and wherein a difference between the first time and the second time is no greater than an adjustment timing period;

generate, via a loudness detector, a loudness level of the first portion of the input audio signal;

identify a compression curve of a plurality of compression curves corresponding to a user volume setting, wherein each of the plurality of compression curves comprises an upward compression portion providing amplification and a downward compression portion providing attenuation, and wherein an intensity of the amplification and attenuation decreases as the user volume setting increases;

adjust, via an audio compressor, the second portion of the input audio signal based on the loudness level and the compression curve to generate an output audio signal.

2. The audio device of claim 1, wherein the adjustment timing period is no greater than approximately six seconds.

3. The audio device of claim 1, further comprising an acoustic transducer configured to generate audio corresponding to the output audio signal.

4. The audio device of claim 1, wherein a volume level of the output audio signal is adjusted according to the user volume setting.

5. The audio device of claim 1, wherein the compression curve comprises a pivot point, a downward compression portion, and an upward compression portion.

6. The audio device of claim 5, wherein the downward compression portion corresponds to a first input power range greater than the pivot point, and wherein the upward compression portion corresponds to a second input power range less than the pivot point.

7. The audio device of claim 1, wherein the loudness level is an integrated loudness of the input audio signal over an integration period.

8. The audio device of claim 7, wherein the integration period is approximately three seconds.

9. The audio device of claim 1, wherein the loudness level is determined according to a Loudness Unit Full Scale (LUFS) model.

10. The audio device of claim 1, wherein the controller is configured to disable the adjustment of the second portion of the input audio signal based on a receiving an adjustment disabling signal.

11. The audio device of claim 10, further comprising a disable switch configured to generate the adjustment disabling signal.

12. The audio device of claim 1, wherein the audio device is a soundbar or a speaker.

13. The audio device of claim 1, wherein the input audio signal corresponds to a High-Definition Multimedia Interface (HDMI) signal or an optical audio signal.

14. The audio device of claim 1, wherein the controller is further configured to determine a content type of the input audio signal, and wherein the adjustment of the second portion of the input audio signal is disabled if the content type is music content.

15. The audio device of claim 1, wherein the compression curve has a frequency range of 20 Hz to 20 kHz.

16. A method for adjusting an input audio signal, comprising:

receiving, via a controller, the input audio signal, wherein the input audio signal comprises a first portion and a second portion, wherein the first portion of the input audio signal begins at a first time, wherein the second portion of the input audio signal begins at a second time following the first time, and wherein a difference between the first time and the second time is no greater than an adjustment timing period;

generating, via a loudness detector of the controller, a loudness level of the first portion of the input audio signal;

identifying, via the controller, a compression curve of a plurality of compression curves corresponding to a user volume setting, wherein each of the plurality of compression curves comprises an upward compression portion providing amplification and a downward compression portion providing attenuation, and wherein an intensity of the amplification and attenuation decreases as the user volume setting increases;

adjusting, via an audio compressor of the controller, the second portion of the input audio signal based on the loudness level and the compression curve to generate an output audio signal.

17. The method of claim 16, further comprising generating, via an acoustic transducer, audio corresponding to the output audio signal.

18. The method of claim 16, further comprising adjusting a volume level of the output audio signal according to the user volume setting.

19. The method of claim 16, wherein the compression curve comprises a pivot point, a downward compression portion, and an upward compression portion.

20. The method of claim 19, wherein the downward compression portion corresponds to a first input power range greater than the pivot point, and wherein the upward compression portion corresponds to a second input power range less than the pivot point.

* * * * *